US008253604B2

(12) United States Patent
Peng

(10) Patent No.: US 8,253,604 B2
(45) Date of Patent: Aug. 28, 2012

(54) KEYBOARD SCANNING CIRCUIT

(75) Inventor: Chin-Yung Peng, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 521 days.

(21) Appl. No.: 12/550,902

(22) Filed: Aug. 31, 2009

(65) Prior Publication Data

US 2010/0148998 A1 Jun. 17, 2010

(30) Foreign Application Priority Data

Dec. 12, 2008 (CN) .......................... 2008 1 0306192

(51) Int. Cl.
*H03K 17/94* (2006.01)
(52) U.S. Cl. ................. 341/26; 341/20; 341/22
(58) Field of Classification Search .............. 341/20, 341/22, 26
See application file for complete search history.

(56) References Cited

U.S. PATENT DOCUMENTS

| 5,805,085 A | * | 9/1998 | Hsu et al. | .......................... 341/26 |
| 7,123,170 B1 | * | 10/2006 | Iacob | .............................. 341/26 |
| 7,495,657 B2 | * | 2/2009 | Cheng | ........................... 345/168 |

OTHER PUBLICATIONS

"Construction of complete combinatorial keyboard circuit", by Jin et al., is published on pp. 780-783 of the Journal of Southwest Jiaotong University (Emei Branch, Emeishan 614202, China) vol. 39, No. 6, Dec. 2004 Contents.

* cited by examiner

*Primary Examiner* — Khai M Nguyen
(74) *Attorney, Agent, or Firm* — Altis Law Group, Inc.

(57) ABSTRACT

A keyboard scanning circuit, comprising N wires, and $[(2^N-1)+(2^{N-1}-1)N]$ switches divided into two switch groups, therein N is a natural number. Each switch includes a first contact and a second contact. The first contacts of the $(2^N-1)$ switches in the first switch group are connected to ground, the second contacts of the $(2^N-1)$ switches in the first switch group are connected to the wires in $(2^N-1)$ connectors. The first contacts of the $(2^{N-1}-1)N$ switches in the second switch group are connected to one of the wires, the second contacts of the $(2^{N-1}-1)N$ switches in the second switch group are connected to the nodes between the switch in the first switch group and the wires.

6 Claims, 4 Drawing Sheets

| closed switch | status of output ports |  |  |
|---|---|---|---|
|  | I/O1 | I/O2 | I/O3 |
| K0 | 0 | 0 | 0 |
| K1 | 1 | 0 | 0 |
| K2 | 0 | 1 | 0 |
| K3 | 1 | 1 | 0 |
| K4 | 0 | 0 | 1 |
| K5 | 1 | 0 | 1 |
| K6 | 0 | 1 | 1 |

FIG. 2

| closed switch | status of input ports | | | status of output ports | | |
|---|---|---|---|---|---|---|
| | I/O1 | I/O2 | I/O3 | I/O1 | I/O2 | I/O3 |
| K7 | 0 | 1 | 1 | 0 | 0 | 0 |
| K8 | 0 | 1 | 1 | 0 | 1 | 0 |
| K9 | 0 | 1 | 1 | 0 | 0 | 1 |
| K10 | 1 | 0 | 1 | 1 | 0 | 0 |
| K11 | 1 | 0 | 1 | 0 | 0 | 0 |
| K12 | 1 | 1 | 0 | 0 | 0 | 1 |
| K13 | 1 | 1 | 0 | 0 | 0 | 0 |
| K14 | 1 | 1 | 0 | 0 | 0 | 1 |
| K15 | 1 | 1 | 0 | 0 | 1 | 0 |

FIG. 3

KEYBOARD SCANNING CIRCUIT

BACKGROUND

1. Technical Field

The disclosure generally relates to keyboard scanning circuits, particularly to a keyboard scanning circuit capable of using fewer ports.

2. Description of Related Art

Traditionally, keyboards are widely used as input means for various electronic devices, such as computers, personal digital assistances (PDAs). Usually, a keyboard includes a plurality of keys capable of being pressed, and a scanning circuit with a row-column type structure. The row-column type structure, also called a switch matrix, is aligned with the keys. The scanning circuit includes a plurality of row wires and a plurality of column wires. The keys are set above intersections where the row wires cross the column wires. A plurality of switches are located at the intersections, with two contacts of each switch being electrically connected to one row wire and one column wire respectively. Therefore, when the key is pressed, the corresponding switch is closed. The row wire and the column wire corresponding to this switch are then electrically connected. When the scanning circuit scans, the column wires are set to either high or low, and the row wires are then used as output. As a result, which switch is closed can be determined.

Referring to FIG. 4, a conventional scanning circuit (not labeled) is used in a keyboard (not shown) having nine keys. The scanning circuit includes three row wires P1.1~P1.3, three column wires P1.4~P1.6, and three resistors R1~R3. The row wires P1.1~P1.3 and the column wires P1.4~P1.6 form a switch matrix (not labeled) including nine intersections. Nine switches S1~S9 are set at the intersections of the scanning circuit respectively, with two contacts of each switch connected to one row wire and one column row. One end of the resistor R1/R2/R3 is connected to one end of the row wire P1.1/P1.2/P1.3 respectively, another end of the resistor R1/R2/R3 is connected to ground. Each switch is normally open until its key is pressed. For example, when a key is pressed, a corresponding switch such as SI closes, the row wire P1.1 and the column wire P1.4 is electrically connected. When the key is released, the corresponding switch such as S1 opens again.

Furthermore, three input ports are electrically connected to ends of the row wires P1.1~P1.3, respectively, and three output ports are electrically connected to ends of the column wires P1.4~P1.6, respectively. During scanning, each input ports is sequentially set low. When one of the input ports P1.1~P1.3 is set low, the rest of the input are set high. The output ports are checked to find out if any switch is closed. Therefore, pressed keys, which correspond to the switches, can be identified. As an example, if the input port of row wire P1.1 is set low, the rest of the ports of the row wires P1.2 and P1.3 are set high. The output port of the P1.4 is also low, and then the switch S1 is determined to be closed. Consequently, the pressed key corresponding to the switch S1 is identified.

In practice, the three input ports and the three output ports are generally provided by a single-chip microprocessor. However, providing a microprocessor with so many ports consumes too much space.

Therefore, there is room for improvement within the art.

BRIEF DESCRIPTION OF THE DRAWINGS

Many aspects of the keyboard scanning circuit can be better understood with reference to the following drawings. The components in the drawings are not necessarily drawn to scale, the emphasis instead being placed upon clearly illustrating the principles of the keyboard scanning circuit.

FIG. 2 shows a truth table of a first switch group of the scanning keyboard shown in FIG. 2.

FIG. 3 shows a truth table of a second switch group of the scanning keyboard shown in FIG. 2.

DETAILED DESCRIPTION

Figure 1:
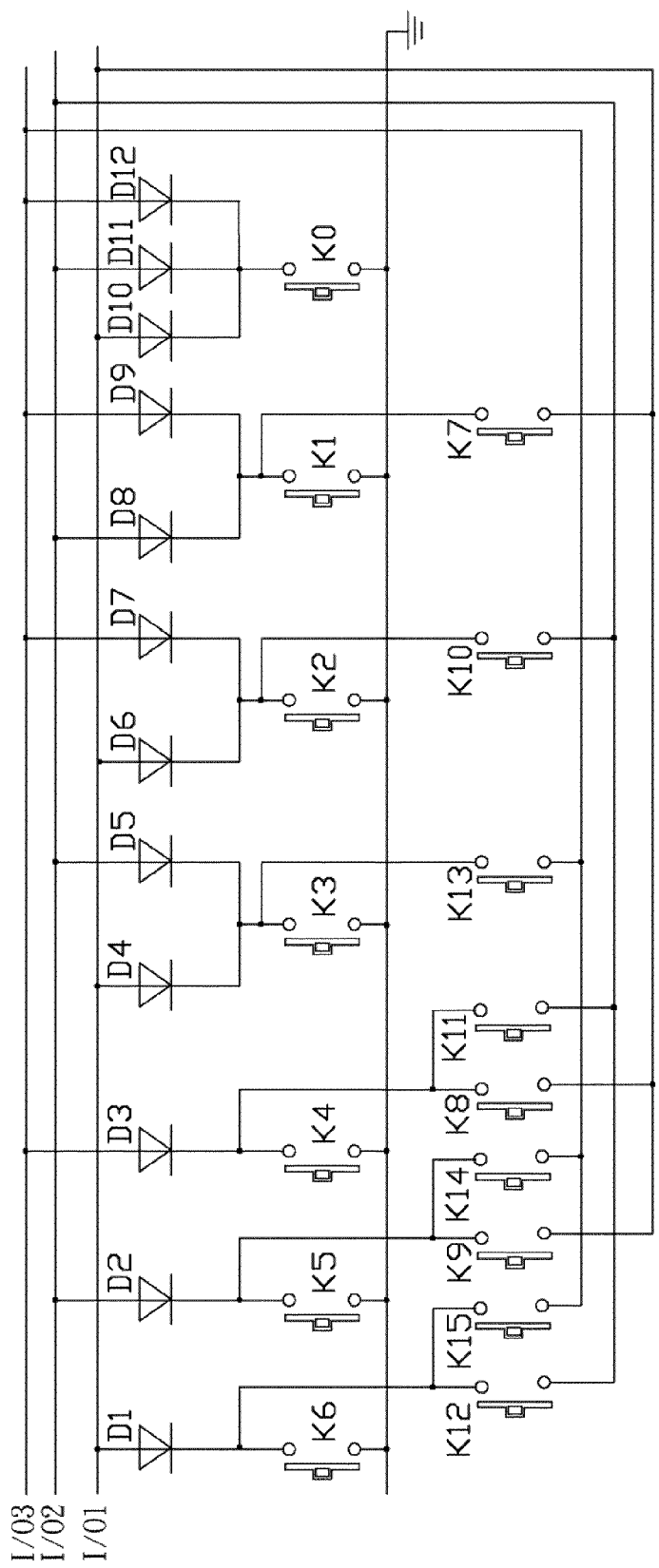
FIG. 1 shows a schematic diagram of a keyboard scanning circuit in accordance with an exemplary embodiment.
Figure 4:
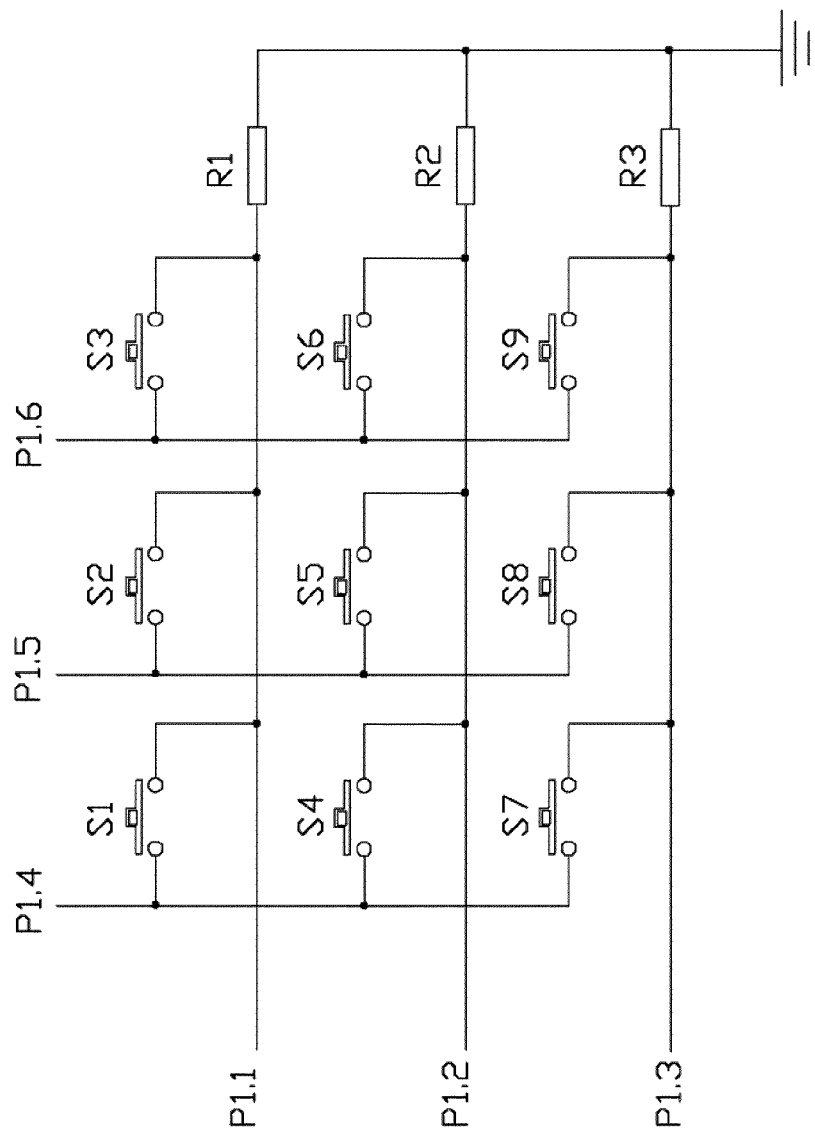
FIG. 4 shows a schematic diagram of a conventional keyboard scanning circuit.

Referring to FIG. 1, a keyboard scanning circuit (not labeled) uses N Input/Output (I/O) wires to realize $[(2^N-1)+(2^{N-1}-1)N]$ keys input, wherein N is a natural number. In this embodiment, N equals three, and the keyboard scanning circuit includes three I/O wires I/O1~I/O3, sixteen switches K0~K15, and twelve diodes D1~D12.

The switches K0~K15 are divided into two groups. A first switch group includes seven switches (K0~K6) and a second switch group includes nine switches (K7~K15). Each switch includes a first contact (not labeled) and a second contact (not labeled). The first contact of each switch in the first switch group is connected to ground, and the second contact of each switch in the first switch group is connected to the wires (I/O1~I/O3) in seven permutation and combination means, respectively. The seven permutation and combination means are the three wires (I/O1~I/O3), the two of the three wires (I/O1~I/O3) (e.g. I/O1 and I/O2, I/O2 and I/O3, I/O3 and I/O1), and one of the three wires (e.g. I/O1, I/O2, and I/O3). The twelve diodes (D1~D12) are set between the first switch group and the wires I/O1~I/O3 to make sure signals flow in one direction. The cathode of the diodes (D1~D12) are connected to the wires (I/O1~I/O3), and anode of the diodes (D1~D12) are connected to switches in the first group.

The first contact of each switch in the second switch group is connected to one of the wires (I/O1~I/O3), that is the first contact of the switch (K7/K8/K9) is connected to the wire I/O1, the first contact of the switch (K10/K11/K12) is connected to the wire I/O2, and the first contact of each switch (K13/K14/K15) is connected to the wire I/O3. The second contact of each switch in the second switch group are connected to nodes (not labeled) between the switch in the first switch group and the wire/s (I/O1~I/O3). The switch in the first switch group connected to second contact of the switch in the second switch group does not connect to the wire, to which the first contact of the switch in the second switch group connected. The wires (I/O1~I/O3) connected to second contact of the switch in the second switch group is the wires which the switch in the first switch group is connected to. For example, the first contacts of the switches (K7~K9) are connected to the wire I/O1, the second contacts of the switches (K7~K9) are connected to the node between the switch (K1, K4, and K5) and the wire/s (I/O2 and I/O3, I/O3, I/O2).

During scanning, each of the wires I/O1~I/O3 has one end connected to an input port and another end connected to an output port. The three input ports and the three output ports are generally provided by a single-chip microprocessor. Firstly, the input ports of the wires I/O1~I/O3 are set high, and the output ports of the wires I/O1~I/O3 are scanned. Referring to FIG. 2, if one switch of the first switch group (K0~K6) is closed, then not all output ports of the wires I/O1~I/O3 are high. For example, if the switch K0 is closed, the wires I/O1~I/O3 are connected to ground, and the output ports of the wires I/O1~I/O3 are all low. It can be deduced from this embodiment that $(2^N-1)$ keys can be determined when the number of the I/O wires is N by the connectors like the first switch group (K0~K6).

Referring to FIG. 3, if all output ports of the wires I/O1~I/O3 are high, that means none of the switches (K0~K6) is closed. Now, the input ports of the wires I/O1~I/O3 are sequentially set low, and scanning the output ports of the wires I/O1~I/O3 again. For example, if the switch K7 is closed, the input ports of the wires I/O1~I/O3 are low, high, high. The wires I/O2 and I/O3 are connected to the wire I/O1, so the output ports of the wires I/O1~I/O3 become low, low, low. In this embodiment, the switches K7~K9, the switches K10~K12, the switches K13~K15 are respectively connected to one of the wires I/O1~I/O3. The switch in the second switch group is determined by setting one input port of the wires I/O1~I/O3 low, and then finding the changes outputs of the output ports of the wires I/O1~I/O3. Therefore, there will be $(2^{3-1}-1)$ connectors of the switches corresponding to one wire. Furthermore, there will be $3\times(2^{3-1}-1)$ connectors of the switches because there are three wires in total. It can be deduced from this embodiment that $(2^{N-1}-1)N$ keys can be determined when the number of the I/O wires is N by the connectors like the second switch group (K7~K15).

Therefore, when the number of the I/O wires is N, the total number of keys can be determined by the keyboard scanning circuit is $[(2^N-1)+(2^{N-1}-1)N]$. Only 2N ports are needed to be provided for the keyboard scanning circuit by a single microprocessor, so the single microprocessor will not be consumed too much space.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A keyboard scanning circuit, comprising:
   N wires; and
   $[(2^N-1)+(2^{N-1}-1)N]$ switches divided into two switch groups; wherein N is a natural number, each switch includes a first contact and a second contact, the first contacts of the $(2^N-1)$ switches in the first switch group are connected to ground, the second contacts of the $(2^N-1)$ switches in the first switch group are connected to the wires in $(2^N-1)$ connectors, the first contacts of the $(2^{N-1}-1)N$ switches in the second switch group are connected to one of the wires, the second contacts of the $(2^{N-1}-1)N$ switches in the second switch group are connected to the nodes between the switch in the first switch group and the wires.

2. The keyboard scanning circuit as claimed in claim 1, further comprising a plurality of diodes set between the first switch group and the wires to keep signals flowing in one direction.

3. The keyboard scanning circuit as claimed in claim 2, cathode of the diodes are connected to the wires, anode of the diodes are connected to switches in the first group.

4. The keyboard scanning circuit as claimed in claim 1, wherein each wire is I/O wire.

5. The keyboard scanning circuit as claimed in claim 1, wherein the switches in the first switch group are determined by setting the input ports of the N wires high, and scanning the output ports of the N wires.

6. The keyboard scanning circuit as claimed in claim 1, wherein the switches in the second switch group are determined by setting the input ports of the wires I/O1~I/O3 sequentially low, and scanning the output ports of the N wires.

* * * * *